United States Patent
Knaipp

(10) Patent No.: US 7,781,809 B2
(45) Date of Patent: Aug. 24, 2010

(54) HIGH VOLTAGE DEPLETION LAYER FIELD EFFECT TRANSISTOR

(75) Inventor: Martin Knaipp, Unterpremstätten (AT)

(73) Assignee: Austriamicrosystems AG, Premstätten (AT)

( * ) Notice: Subject to any disclaimer, the term of this patent is extended or adjusted under 35 U.S.C. 154(b) by 0 days.

(21) Appl. No.: 11/578,018

(22) PCT Filed: Apr. 6, 2005

(86) PCT No.: PCT/EP2005/003623

§ 371 (c)(1),
(2), (4) Date: Jul. 27, 2007

(87) PCT Pub. No.: WO2005/098964

PCT Pub. Date: Oct. 20, 2005

(65) Prior Publication Data

US 2008/0067560 A1    Mar. 20, 2008

(30) Foreign Application Priority Data

Apr. 8, 2004  (DE) .................. 10 2004 018 153

(51) Int. Cl.
*H01L 21/337*  (2006.01)
*H01L 27/088*  (2006.01)

(52) U.S. Cl. .................. 257/285; 257/134; 257/256; 257/272; 257/274; 257/E29.01; 257/E21.445; 438/186

(58) Field of Classification Search .......... 257/285, 257/134, 141, 256, 265, 272, 273, 274, E29.01, 257/E21.445; 438/186
See application file for complete search history.

(56) References Cited

U.S. PATENT DOCUMENTS

| 3,841,917 | A | | 10/1974 | Shannon |
| 4,185,291 | A | | 1/1980 | Hirao et al. |
| 4,816,880 | A | | 3/1989 | Muro |
| 4,939,099 | A | * | 7/1990 | Seacrist et al. ............... 438/189 |

(Continued)

FOREIGN PATENT DOCUMENTS

EP  0 268 426 A  5/1988

(Continued)

OTHER PUBLICATIONS

Patent Abstracts of Japan vol. 003 No. 015 (E-089), Feb. 9, 1979 of Patent 53-143183 A (Hitachi LTD), Dec. 13, 1978.*

(Continued)

*Primary Examiner*—Fernando L Toledo
*Assistant Examiner*—John P Dulka
(74) *Attorney, Agent, or Firm*—Cohen Pontani Lieberman & Pavane LLP

(57) ABSTRACT

In a high voltage junction field effect transistor, a first well (11) of a first conductivity type is formed in a substrate (10) of a second conductivity type. A source (14) and a drain (15) which are each of the first conductivity type are formed in the first well. A gate (16) of the second conductivity type is arranged in a second well (12) of the second conductivity type, wherein the second well is of the retrograde type. The source, gate and drain are spaced apart from one another by field oxide regions (13a to 13d). Field plates (17a, 17b) extend over the field oxide (13a, 13b) from the gate (16) in the direction of source and drain.

19 Claims, 3 Drawing Sheets

U.S. PATENT DOCUMENTS

| | | | | |
|---|---|---|---|---|
| 5,008,719 | A | * | 4/1991 | Schrantz ..................... 257/261 |
| 5,373,183 | A | * | 12/1994 | Beasom ...................... 257/487 |
| 5,889,298 | A | | 3/1999 | Plumton et al. |
| 6,096,587 | A | | 8/2000 | Imoto et al. |
| 6,153,453 | A | | 11/2000 | Jimenez et al. |
| 6,271,550 | B1 | * | 8/2001 | Gehrmann .................. 257/285 |
| 6,355,513 | B1 | | 3/2002 | Yu |
| 2002/0132406 | A1 | | 9/2002 | Disney |
| 2003/0151101 | A1 | * | 8/2003 | Rumennik et al. .......... 257/393 |
| 2003/0168704 | A1 | * | 9/2003 | Harada et al. ............... 257/368 |
| 2004/0063291 | A1 | | 4/2004 | Williams et al. |

FOREIGN PATENT DOCUMENTS

| | | | |
|---|---|---|---|
| EP | 0 907 208 | A1 | 10/1997 |
| EP | 0 981 166 | A | 2/2000 |
| JP | 53 143183 | A | 12/1978 |
| JP | 53143183 | A * | 12/1978 |
| JP | 54 149478 | A | 11/1979 |
| JP | 63 211683 | | 9/1988 |
| JP | 2-34938 | | 2/1990 |
| JP | 5-182993 | | 7/1993 |
| JP | 6-13409 | | 1/1994 |
| JP | 9-307070 | | 11/1997 |
| JP | 2001-332702 | | 11/2001 |

OTHER PUBLICATIONS

Nouailhat et al., "Performance Evaluation of CMOS Compatible Bipolar Transistors and Vertical Junction FETS for Advanced VLSI Technology", Electronics Letters, IEE Stevenage, GB, vol. 28, No. 23, pp. 2195-2196, Nov. 5, 1992.

* cited by examiner

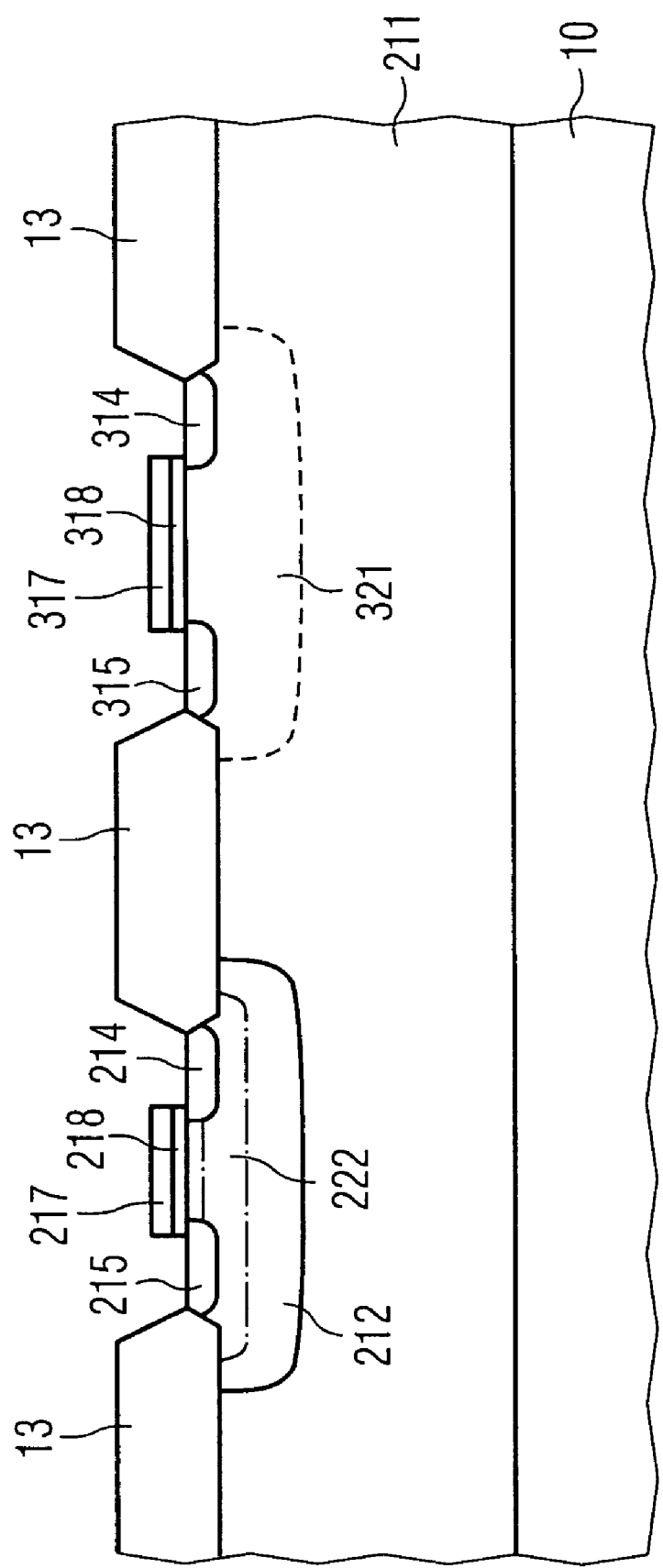

HIGH VOLTAGE DEPLETION LAYER FIELD EFFECT TRANSISTOR

RELATED APPLICATIONS

This is a U.S. national stage of International Application No. PCT/EP2005/003623, filed on Apr. 6, 2005.

This patent application claims the priority of German patent application no. 10 2004 018 153.5. filed Apr. 8, 2004, the disclosure content of which is hereby incorporated by reference.

FIELD OF THE INVENTION

The invention relates to a high voltage junction field effect transistor comprising a first well of a first conductivity type in a substrate of a second conductivity type, comprising a source and a drain in the first well, which are each of the first conductivity type, comprising a gate of the second conductivity type, which is arranged in a second well of the second conductivity type.

BACKGROUND OF THE INVENTION

A field effect transistor of this type is known as a junction field effect transistor (JFET). One advantage of this type of field effect transistor is the low noise. In conjunction with an integrated circuit, these field effect transistors are used in particular in power applications. One aim of these applications is to provide a transistor which combines a high breakdown voltage with a low resistance in the on state and requires a small area. Special production processes are customary for the JFETs with epitaxial layers.

US 2002/0132406 A1 discloses a vertical high voltage transistor comprising multiple depletion layer conduction channels, which transistor contains zones that are buried in planes of an n-type well lying one above another.

U.S. Pat. No. 6,153,453 discloses a method for producing a junction field effect transistor in conjunction with further MOS transistors which are used at low voltages and frequencies. The low voltage process used for the MOS transistors is used with small changes for the production of the junction field effect transistor.

SUMMARY OF THE INVENTION

One object of the invention is to provide an improved high voltage junction field effect transistor which can essentially be produced by means of a low voltage process.

This and other objects are attained in accordance with one aspect of the present invention directed to a high voltage junction field effect transistor comprising a first well of a first conductivity type in a substrate of a second conductivity type, a source and a drain in the first well, which are each of the first conductivity type, and a gate of the second conductivity type which is arranged in a second well of the second conductivity type, wherein the second well is of the retrograde type, and wherein the source, gate and drain are spaced apart from one another by isolation regions.

The invention has the advantage that the high voltage junction field effect transistor can be produced together with further transistors of an integrated circuit without the low voltage process having to be significantly changed. The properties of the low voltage transistors or else of the other high voltage transistors can thus be maintained. The JFET can be produced using only one further mask, which can also be used for the production of further high voltage transistors. The retrograde well (second well) produced beneath the gate has the effect of controlling the electric field strengths between the highly doped zones, so that the junction field effect transistor according to the invention can be operated at high voltages without the risk of a breakdown.

It is advantageous if beneath the source and drain terminal, respectively, a shallow well in each case extends into the deep well.

One refinement of the invention provides for field plates to be produced on field oxide regions arranged between the highly doped terminal regions, field control being possible by means of said field plates. The field plates can be produced simultaneously with the electrodes of the MOS transistors of the low voltage process.

One preferred embodiment provides for the field plates to end approximately above the pn junction between the first well and the retrograde well.

In another embodiment, the field plates are electrically connected to the respectively assigned source and/or drain terminal regions.

In accordance with another aspect of the invention directed to a method for producing the high voltage field effect transistor, the high voltage field effect transistor is produced simultaneously with further MOS transistors in the second well by means of a masking for the retrograde well and subsequent ion implantation.

preferably, a mask is used to set a smaller width ("layer thickness" in the substrate) of the first well beneath the second well than outside the second well.

BRIEF DESCRIPTION OF THE DRAWINGS

The invention is explained in more detail below on the basis of exemplary embodiments in the Figures of the drawing. The Figures serve solely for illustrating the invention and are therefore realized only in schematic fashion and not in a manner true to scale. Different regions of identical conductivity type are schematically delimited by dotted or dashed lines, while regions of different conductivity types are schematically delimited by means of solid lines. Identical elements or identically acting elements are provided with identical reference symbols. In the Figures:

FIG. 5 shows a schematic cross section through an n-channel and a p-channel low voltage field effect transistor in connection with FIG. 4.

DETAILED DESCRIPTION OF THE DRAWINGS

Figure 1:
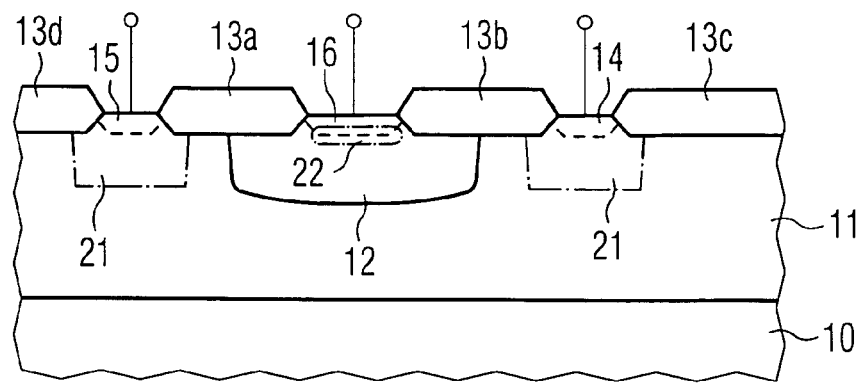
FIG. 1 shows a schematic cross section through a first exemplary embodiment of a junction field effect transistor according to the invention.

In accordance with FIG. 1, a deep n-doped well 11 is arranged in a substrate 10, in particular having p-type conductivity. Field oxide regions 13a to 13d are produced at the surface of the arrangement, that is to say on the surface of the well 11. The field oxide regions 13 leave windows free in which the terminal regions of the field effect transistors are arranged as highly doped zones. Thus, the source terminal 14 and the drain terminal 15 are produced in the deep n-type well 11. Both regions 14 and 15 are highly doped and have n-type conductivity. The gate 16 is produced in a window between source and drain, in a manner isolated by field oxide regions 13a and 13b. The gate terminal 16 has p-type conductivity and is highly doped. The junction field effect transistor is accordingly an n-channel junction field effect transistor (NJFET).

A deep p-doped well 12 is implanted as a retrograde well beneath the gate 16, said well extending as far as below the field oxide regions 13a and 13b. The retrograde well 12 has a center of its doping concentration approximately centrally between the lower edge of the field oxide and the boundary region with respect to the deep n-type well 11. The depletion layer channel lies beneath the deep p-type well 12 in the deep n-type well 11, the width of said channel being controlled by the negative potential applied to the gate 16. The current flow between source and drain can thus be controlled by means of the gate potential in a known manner. The depletion layer channel is characterized by the n-type well 11 and the p-type well 12 and the dopings thereof.

The deep n-type well 11 and the highly doped regions 14, 15 and 16 can be produced simultaneously with corresponding regions of an integrated circuit. The same applies to the field oxide regions 13. The retrograde well 12 requires an additional masking by comparison with a conventional low voltage process, said additional masking being used simultaneously to produce other retrograde wells for high voltage field effect transistors on the integrated circuit.

In order to further improve the dielectric strength or the high voltage properties, a shallow n-type well 21 extending into the deep n-type well 11 is in each case provided beneath the source and drain terminals 14 and 15, respectively. A shallow p-doped well 22 extending into the deep p-type well is likewise provided beneath the gate terminal 16. The shallow p-type well is likewise implanted as a retrograde well. The shallow wells 21 and 22 are more lightly doped than the overlying terminal regions 14, 15 and 16, respectively, but are more highly doped than the deep wells 11 and 12, respectively. As a result, it is possible to control the electric field strength, so that the junction field effect transistor according to the invention can be operated at high voltages without the risk of a breakdown.

Figure 2:
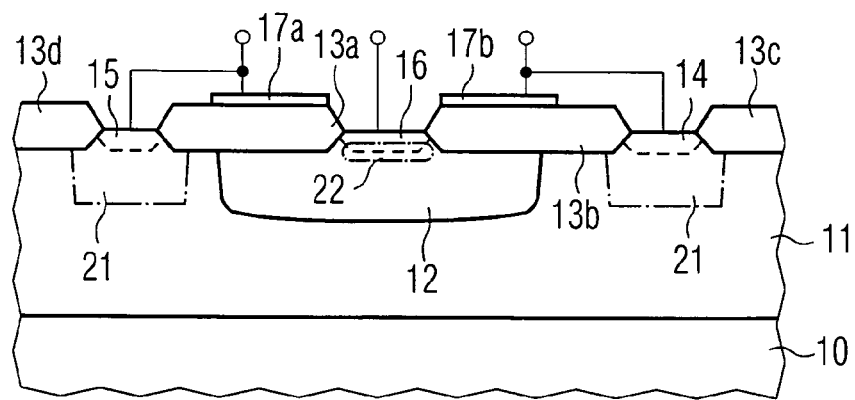
FIG. 2 shows a schematic cross section through a second exemplary embodiment of the junction field effect transistor according to the invention.

In order to reliably prevent a breakdown between gate and source or drain at the surface of the arrangement at particularly high voltages or potentials, the exemplary embodiment in accordance with FIG. 2 additionally provides, by comparison with FIG. 1, field plates 17a and 17b on the field oxide regions 13a and 13b, respectively. In this case, the field plate 17a is electrically connected to the drain 15, while the field plate 17b is electrically connected to the source 14. The field plates 17 extend approximately from the gate 16 as far as above the edge of the retrograde well 12. The field plates 17 have a high conductivity and are produced e.g. as polysilicon regions simultaneously with gate electrodes of other transistors.

During the production of the wells, which in this case relate only by way of example to a 0.35 µm low voltage process, firstly the n-type well 11 is produced in the substrate 10. phosphorus ions with an energy of preferably approximately 300 keV and a dose of approximately $8.3 \times 10^{12}$ cm$^{-3}$ are produced by means of a large-area implantation in the region of the envisaged JFET. phosphorus ions are more mobile than arsenic ions, which can likewise be used in principle, and bring about a more uniform doping distribution in the n-type well.

Afterward, the p-type well 12 is produced. By means of a masking known per se, said masking having a window in the region of the well to be produced, p-type ions, preferably boron ions, are implanted. In this case, provision is made of a double implantation with firstly approximately 300 keV and a dose of approximately $5 \times 10^{12}$ cm$^{-3}$, and afterward an implantation with the energy of approximately 150 keV and the same dose of approximately $5 \times 10^{12}$ cm$^{-3}$.

The dopants of the doped regions outdiffuse during subsequent thermal process steps, for example in connection with the production of the field oxide regions. However, the deep n-type well 11 has already undergone almost complete outdiffusion before the implantation of the deep p-type well 12 by virtue of an n-type diffusion that took place at the beginning of the process, e.g. at 1150° C. over 700 minutes. The deep p-type well 12 is embodied as a retrograde well in which, even after carrying out the thermal steps, a higher dopant concentration is present in the well depth than in the upper region of the well.

The field plates 17 permit an improved control of the electric field, so that the concentration of the n-type well 11 can be increased. At the same time, the improved field control permits a higher transistor current in the on state. Furthermore, the lateral extent of the junction field effect transistor can be reduced in size without an electrical breakdown occurring.

Figure 3:
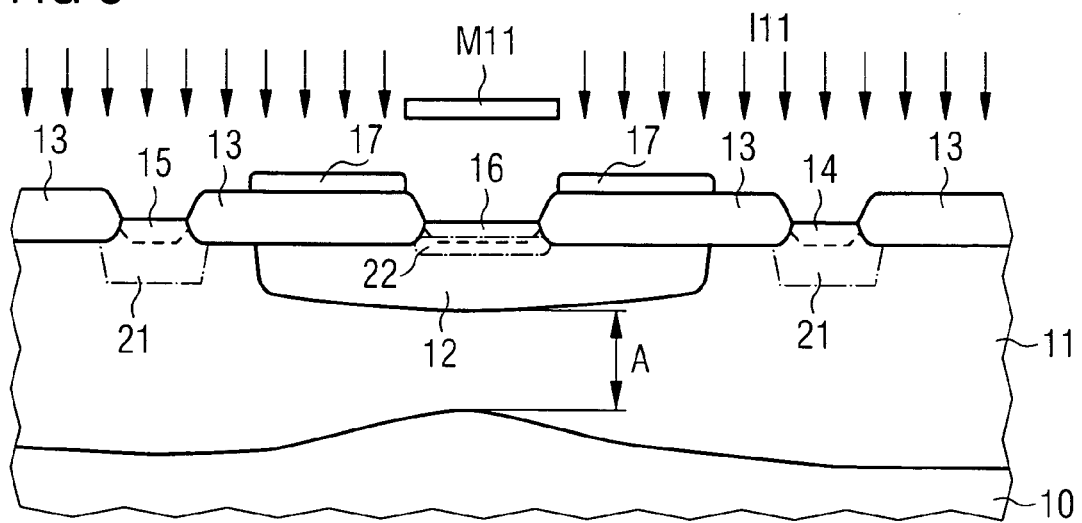
FIG. 3 shows a schematic cross section through a third exemplary embodiment of the junction field effect transistor according to the invention for elucidating the production of the threshold voltage.

The illustration in accordance with FIG. 3 shows how it is possible to set the threshold voltage of the transistor according to FIG. 2. For this purpose, during the implantation I11 of the deep n-type well 11, in the region of the later-formed gate terminal 16, a defined implantation window is provided by means of the shading mask M11 during the large-area implantation. The mask M11 has the effect that below it fewer phosphorus ions penetrate less deeply into the substrate 10 than outside the shading mask M11. As a result, after the subsequent thermal steps, in this region the deep n-type well does not extend as deeply into the substrate 10 as outside this region and the result is the reduced well depth of the deep n-type well 11 shown. The distance A can then be set from the bottom of the retrograde deep p-type well 12 with the production thereof. The deep n-type well 11 is implanted symmetrically about the gate region through strip-type implantation openings in the shading mask. The smaller the distance A, the smaller the threshold voltage of the transistor. With a large distance A, favorable resistances are obtained owing to the high threshold voltage. In this case, however, the field plates 17 are required for controlling the electric field in order that the high gate voltage can be applied.

A typical application for a JFET such as one according to the present invention is as follows. This transistor type is "normally on" (i.e a current flows between the drain and source) when a voltage is applied thereto and the gate-source voltage is zero. The transistor can be switched off by increasing the voltage between gate and source from zero to a maximum value. A power up procedure for an integrated circuit (IC) can be a critical phase because the normal function mode of the IC has not been reached yet. In this application, a voltage to the IC or to the drain-source of the JFET causes a current flow which is used to establish a normal operation mode of a voltage regulator. Thereafter, the JFET can be switched off because the voltage regulator will have taken over the voltage regulation function and the JFET is not needed any longer for normal IC operation.

Figure 4:
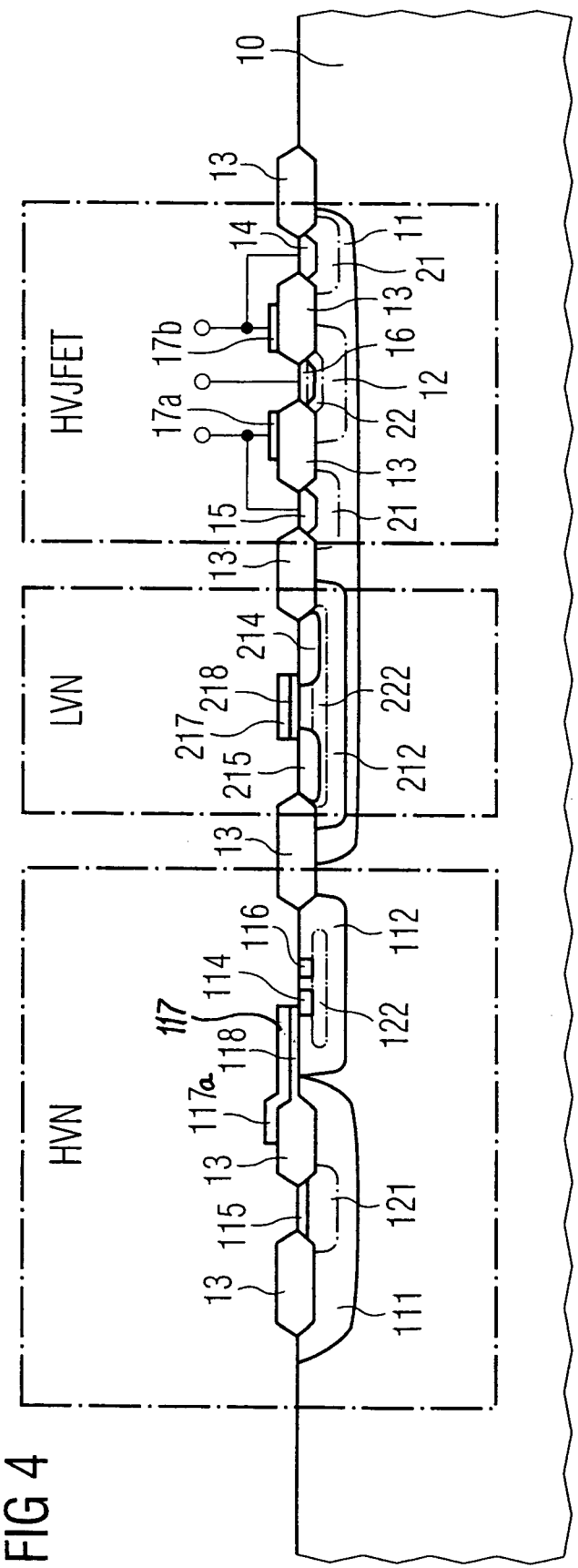
FIG. 4 shows a schematic cross section through a junction field effect transistor according to the invention together with further transistors.

The illustration in accordance with FIG. 4 shows a junction field effect transistor HVJFET of the type described together with a low voltage transistor LVN and a further n-channel high voltage transistor HVN, which each have an insulated gate. For the sake of clarity, all the terminal regions for gate, source and drain are illustrated using solid lines.

According to FIG. 4, the n-channel low voltage transistor is arranged as LVN with drain 215, source 214 and gate 217, which is insulated by a gate oxide 218, in a retrograde deep p-type well 212, which is produced together with the deep p-type well 12 and the deep p-type well 112. In the deep p-type well 212, a shallow p-type well 222 lies beneath the terminal regions. The channel zone lies between drain and source. In this case, provision is made for the n-channel low voltage transistor LVN and the junction field effect transistor HVJFET to be arranged or produced in the same deep n-type well 11.

The high voltage transistor HVN has the n-doped drain 115 in a window between field oxide regions 13, and below said drain lies a shallow n-type well 121, which in turn lies in the deep n-type well 111. This well construction reduces the field strength loading. The n-doped source 114 extends as far as a shallow p-type well 122 arranged in a retrograde deep p-type well 112. A likewise n-doped region 116 serves as ground terminal (body). The gate electrode 117 insulated by means of a gate oxide 118 lies above the channel zone of the deep p-type well 112, and extends as far as the field oxide region 13, where it forms a field plate 117a for field control.

In accordance with FIG. 5, in an enlarged manner, the n-channel low voltage transistor LVN in accordance with FIG. 4 is arranged together with a p-channel low voltage transistor LVp in a deep n-type well 211. The p-channel low voltage transistor LVp has the terminal regions 314 and 315 for source and drain and also the gate 317 above the gate oxide 318. Source and drain and also the channel zone lie in a shallow n-type well 321.

As is evident, in accordance with an embodiment of the invention, the deep n-type wells 11, 111 and 211 and also the deep p-type wells 12, 112 and 212 can be produced in the same process step of the low voltage process. The shallow n-type wells 21, 121 and 321 and also the shallow p-type wells 22, 122 and 222 can likewise be produced in the same process step. This so-called reuse of the wells or the masks therefor enables an extremely cost-effective production process. The following assignments are effected in this case.

In the high voltage transistor, the deep n-type well 111 forms the drift zone for the NMOS transistor. The lightly doped deep n-type wells 11, 111 and 211 generally act as an insulation element with respect to the p-type substrate 10. The relatively highly doped shallow n-type well 121 serves for field strength reduction (drain engineering) of the high voltage transistor, as do the shallow n-type wells 21 and 321.

The deep p-type well 112 and 212 produced with the retrograde well 12 respectively forms the channel region of the high voltage transistor HVN and of the low voltage transistor LVN. The shallow p-type well 122 and 22 serves as the channel region of the high voltage NMOS transistor HVN and, respectively, is provided in the gate region of the high voltage junction field effect transistor. Furthermore, it is provided as element 222 for the n-channel low voltage transistor LVN.

The described functional multiple use of the wells represented for different transistors forms a considerable gain in efficiency in the production of such high voltage components by means of a low voltage process. With only four wells it is possible to produce both low voltage and high voltage transistors. In this way, a significant number of masks and of lithography steps and thus of process costs can be saved by comparison with other methods for producing such mixed components. Although the different transistors are formed by the same process, the high voltage transistors and the low voltage transistors can be optimized independently of one another. For example, the area of the high voltage transistor can be reduced and, thus, optimized without any adverse effect on the low voltage transistors. By this means, too, it is possible, particularly in the case of the lateral high voltage transistors, to save silicon or substrate area, which likewise has a cost-effective effect.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A high voltage junction field effect transistor comprising:
a first well of a first conductivity type in a substrate of a second conductivity type;
a second well of the second conductivity type arranged in the first well;
a source and a drain each of the first conductivity type arranged in the first well and disposed outside the second well; and
a highly doped gate of the second conductivity type arranged in the second well of the second conductivity type,
wherein the second well is of the retrograde type,
wherein the source, gate and drain are spaced apart from one another by isolation regions, and
wherein a channel is beneath the second well in the first well.

2. The field effect transistor as claimed in claim 1, in which beneath the source and the drain, a further well of respectively the same conductivity type extends into the first well, and in which beneath the gate a further well of the same conductivity type extends into the second well.

3. The field effect transistor as claimed in claim 2, wherein the further well beneath the source and the drain is more lightly doped than the source and the drain and more highly doped than the first well, and wherein the further well beneath the highly doped gate is more lightly doped than the highly doped gate and more highly doped than the second well.

4. The field effect transistor as claimed in claim 1, wherein the second well is doped during the implantation with a dose of approximately $5\times10^{12}$ cm$^{-3}$.

5. The field effect transistor as claimed in claim 1, wherein field plates extend on the isolation regions from the gate in the direction of source and drain.

6. The field effect transistor as claimed in claim 5, wherein the field plates end approximately above the semiconductor junction between the second well and the first well.

7. The field effect transistor as claimed in claim 5, wherein a source-side field plate of the field plates is electrically connected to the source and a drain-side field plate of the field plates is electrically connected to the drain.

8. The field effect transistor as claimed in claim 1, wherein the width of the first well is smaller beneath the gate region than outside the gate region, and the, depth of the first well in an area under the second well to the substrate is smaller than the depth of the first well in an area not under the second well.

9. The field effect transistor as claimed in claim 1, wherein the first well does not extend as far into the substrate in a region of the highly doped gate as in a region outside the region of the highly doped gate.

10. The field effect transistor as claimed in claim 1, wherein the highly doped gate is arranged between the source and the drain and is isolated from the source and drain by the isolation regions.

11. The field effect transistor as claimed in claim 1, wherein the second well extends below the isolation regions.

12. The field effect transistor as claimed in claim 1, wherein there is a higher dopant concentration in a depth of the second well than in an upper region of the second well.

13. The field effect transistor as claimed in claim 1, wherein a center of the doping concentration of the second well is approximately centrally between a lower edge of the isolation regions and a boundary region of the second well with respect to the first well.

14. A high voltage junction field effect transistor comprising:
   a first well of a first conductivity type in a substrate of a second conductivity type;
   a second well of the a second conductivity type arranged in the first well;
   a source and a drain each of the first conductivity type arranged in the first well and disposed outside the second well; and
   a highly doped gate of the second conductivity type arranged in the second well of the second conductivity type,
   wherein the second well is of the retrograde type,
   wherein the source, gate and drain are spaced apart from one another by isolation regions,
   wherein a channel is beneath the second well in the first well,
   wherein field plates extend on the isolation regions from the gate in the direction of source and drain,
   wherein a source-side field plate of the field plates is electrically connected to the source and a drain-side field plate of the field plates is electrically connected to the drain, and
   wherein the field plates extend approximately from the gate to above a semiconductor junction between the second well and the first well.

15. A method for producing a high voltage junction field effect transistor comprising:
   forming first and second wells of a first conductivity type in a substrate of a second conductivity type, a third well of the second conductivity type in the first well and a fourth well of the second conductivity type in the second well, wherein the first well is produced together with the second well and the third well is produced together with the forth well;
   forming a source and a drain of the first conductivity type of a high-voltage field effect transistor in the first well, the source and drain being disposed outside the third well;
   forming a gate of the second conductivity type of the high-voltage field effect transistor in the third well;
   forming a source and a drain of a low-voltage field-effect transistor in the fourth well; and
   forming an insulated gate of the low-voltage field-effect transistor in the fourth well, wherein the third well and the forth well are retrograded type.

16. The method as claimed in claim 15, wherein a mask is used to set a width of the first well in an area under the second well to be smaller than the depth of the first well in an area not under the second well.

17. The method as claimed in claim 15, wherein the implantation of the first well takes place through openings in a mask which are arranged in strip-type fashion.

18. The method as claimed in claim 15, wherein the second well is produced by double implantation.

19. The method as claimed in claim 15, wherein the high-voltage field-effect transistor and the low-voltage field-effect transistor are produced by means of a masking for the third and fourth wells and subsequent ion implantation, and the third and fourth wells obtain a retrograde type.

* * * * *